US008242810B2

United States Patent
Fedan et al.

(10) Patent No.: US 8,242,810 B2
(45) Date of Patent: Aug. 14, 2012

(54) FAST SETTLING, BIT SLICING COMPARATOR CIRCUIT

(75) Inventors: Orest Fedan, Belmont, MA (US); Stephen Bourque, Littleton, MA (US)

(73) Assignee: LoJack Operating Company, LP, Canton, MA (US)

( * ) Notice: Subject to any disclaimer, the term of this patent is extended or adjusted under 35 U.S.C. 154(b) by 0 days.

(21) Appl. No.: 12/589,367

(22) Filed: Oct. 22, 2009

(65) Prior Publication Data

US 2011/0095790 A1    Apr. 28, 2011

(51) Int. Cl.
*H03K 5/22* (2006.01)
*H03K 5/153* (2006.01)

(52) U.S. Cl. .............................. 327/90; 327/77; 327/205

(58) Field of Classification Search ............... 327/58–90
See application file for complete search history.

(56) References Cited

U.S. PATENT DOCUMENTS

| 4,821,292 | A  | * | 4/1989  | Childress ..................... 375/319 |
| 7,633,320 | B2 | * | 12/2009 | Yamamoto et al. ............. 327/60 |
| 2009/0189646 | A1 | * | 7/2009 | Cagno et al. .................... 327/77 |

FOREIGN PATENT DOCUMENTS

JP          01018311 A  *  1/1989

OTHER PUBLICATIONS

McGregor, "Low Power RF Transceivers", University of Glasgow (Thesis), Jun. 2008 (retrieved on Oct. 21, 2010). Retrieved from the Internet URL:http://theses.gla.ac.uk/464/01/IanMcGregorThesis.pdf, 153 pgs.

Microchip PICMicro® Comparator Tips N Tricks, Microchip Technology, Inc., Dec. 2003 [retrieved on Oct. 21, 2010); Retrieved from the Internet: <URL:http://ww1.microchip.com/downloads/en/devicedoc/41215a.pdf, 61 pgs.

Written Opinion of the International Searching Authority, International Application No. PCT/US2010/002417, 4 pgs. (unnumbered).

* cited by examiner

*Primary Examiner* — Quan Tra

(74) *Attorney, Agent, or Firm* — Goodwin Procter LLP

(57) ABSTRACT

An improved fast settling bit slicing comparator circuit includes a comparator having a non-inverting and inverting input; the non-inverting input receiving an input signal; a filter circuit for receiving the input signal and being connected with the inverting input of the comparator; a positive feedback circuit interconnected between the output of the comparator and the non-inverting input of the comparator for introducing a predetermined hysteresis offset; the filter circuit including a filter resistance and filter capacitance having a reduced time constant sufficient to compensate for at least a portion of the hysteresis offset. Additionally, the positive feedback circuit may be interconnected with the inverting input of the comparator through the filter circuit for gradually reducing the effect of the hysteresis offset by reducing the differential voltage between the inverting and non-inverting inputs.

9 Claims, 3 Drawing Sheets

FAST SETTLING, BIT SLICING COMPARATOR CIRCUIT

FIELD OF THE INVENTION

This invention relates to an improved fast settling bit slicing comparator according to this invention.

BACKGROUND OF THE INVENTION

There are basically two types of digital radio receivers. One type uses digital signal processing (DSP). This type samples one of the intermediate frequencies or the demodulated audio frequency using an A/D converter. The digital information is then processed to perform demodulation or make decisions on where the zero crossings are thus determining the 1s and 0s of the digital information. The other type of digital radio receiver must demodulate the received radio signal and produce an audio signal. That audio signal does not have sharp transitions and it is often noisy. A bit slicer must then sharpen the edges. The output of the bit slicer is then presented to a microprocessor as digital information. The task of the bit slicer is that it must determine where the zero crossings occur. Often the audio is a low amplitude sine wave riding on top of a large dc voltage. Comparators are used to perform bit slicing. If one of the inputs to the comparator (the filtered input) is biased at a dc voltage halfway between the extreme peaks of the sine wave signal, then each time that the sine wave signal crosses that voltage the output state of the comparator changes, thus converting the sine wave into a digital signal with sharp edges. The problem with this is that the large dc voltage upon which the low amplitude sine wave rides drifts with time and temperature and it is difficult to predict its value. Further, it usually takes a long time after power is applied for that dc voltage to settle. During that time the low amplitude sine wave is riding on a dc voltage which is constantly drifting, as it settles to its final value. This presents a problem for low power consumption receivers which must start receiving immediately upon power up in order to minimize the on time of the receiver.

SUMMARY OF THE INVENTION

In accordance with various aspects of the subject invention in at least one embodiment the invention presents an improved bit slicing comparator which is faster settling and more accurate.

The subject invention results from the realization that, in part, an improved bit slicing comparator in various aspects can be achieved by reducing the size of the filter capacitance at the filtered input of the comparator so that the residual sine wave at the filtered input can compensate for at least a portion of the hysteresis effect introduced by the positive feedback and/or applying the positive feedback through the filter to the inverting as well as non-inverting input for gradually reducing the effect of hysteresis offset so that it is less just prior to the next zero crossing.

The subject invention, however, in other embodiments, need not achieve all these objectives and the claims hereof should not be limited to structures or methods capable of achieving these objectives.

This invention features an improved fast settling bit slicing comparator circuit including a comparator having a non-inverting and inverting input. The non-inverting input receives an input signal. A filter circuit receives the input signal and is connected with the inverting input of the comparator. A positive feedback circuit is interconnected between the output of the comparator and the non-inverting input of the comparator for introducing a predetermined hysteresis offset. The filter circuit includes a filter resistance and filter capacitance having a reduced time constant sufficient to compensate for at least a portion of the hysteresis offset.

In preferred embodiments the positive feedback circuit may be additionally interconnected with the inverting input of the comparator through the filter circuit for gradually reducing the effect of the hysteresis offset by reducing the differential voltage between the inverting and non-inverting inputs. The positive feedback circuit may be interconnected to the non-inverting input through a balancing resistance for balancing bias currents inherent in the comparator. The filter circuit may include a diode in parallel with the filter resistance for accelerating the charging of the filter capacitance up to the level of the voltage difference between the average level and diode drop.

This invention also features an improved fast settling bit slicing comparator circuit including a comparator having a non-inverting and inverting input. The non-inverting input receives an input signal. A filter circuit receives the input signal and is connected with the inverting input of the comparator. A positive feedback circuit is interconnected between the output of the comparator and the non-inverting input of the comparator for introducing a predetermined hysteresis offset and is interconnected with the inverting input of the comparator through the filter circuit for gradually reducing the effect of the hysteresis offset by reducing the differential voltage between the inverting and non-inverting inputs.

In preferred embodiments the filter circuit may include a filter resistance and filter capacitance having a reduced time constant sufficient to compensate for at least a portion of the hysteresis offset. The filter circuit may include a diode in parallel with the filter resistance for accelerating the charging of the filter capacitance up to the level of the voltage difference between the average level and diode drop.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
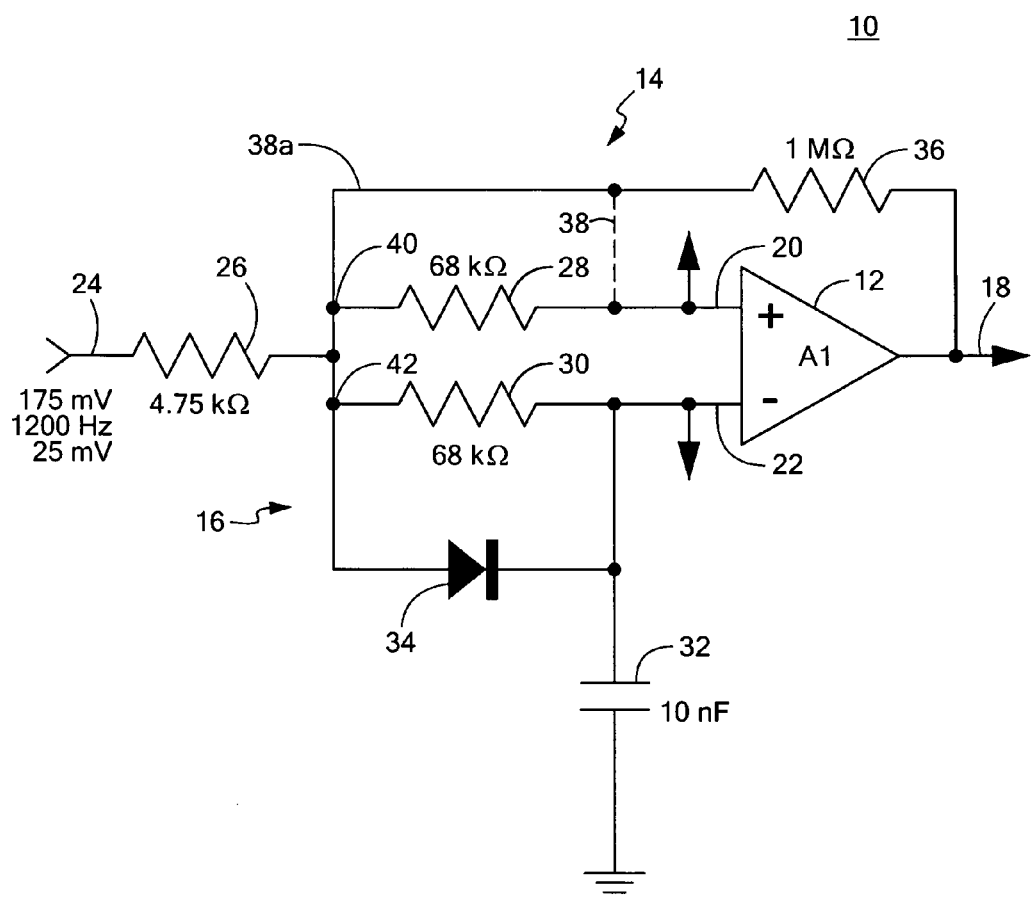
FIG. 1 is a schematic diagram for a fast settling bit slicer comparator circuit according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

In conventional bit slicing comparator circuits positive feedback connected to the non-inverting input is used to introduce a hysteresis offset to boost the input signal from a demodulator output in order to reduce errors from multiple transitions caused by noise. This works well but it causes the transitions of the comparator to be delayed to a later time introducing another, different source of error especially regarding inter-symbol interference. To overcome this, this invention reduces the filter capacitor and filter time constant providing just enough ripple at the filtered input to compensate for at least a portion of the delay introduced by the positive feedback to the non-inverting input of the comparator. Reduction of the filter capacitance can only be done keeping in mind the need to provide a reference signal at the inverting input of the comparator sufficient to allow for an adequate differential between the inverting and non-inverting inputs of the comparator. However, this invention goes further and uses an enhanced positive feedback which provides the positive feedback to both the filtered inverting input and non-inverting input of the comparator. This increases the ripple of the reference signal at the filtered inverting input sufficiently to remove the remainder of the delay and does so without further decreasing the filter capacitance. Finally, this invention may employ a diode to shunt the input resistance to the filter capacitor and speed-up its charging time up to the voltage difference between the average dc input and the diode drop (when the input voltage is larger than the diode drop), after which continual charging occurs only to the extent that the input signal diverges from that average dc level.

There is shown in FIG. 1 a schematic diagram of a fast settling, bit slicing comparator circuit 10 according to this invention. Comparator circuit 10 includes comparator 12 with a positive feedback circuit 14 and filter circuit 16. Comparator 12 has an output 18 which provides a square wave digital signal typically to a subsequent microprocessor. It also has a non-inverting input 20 and inverting input 22. Input 24 of comparator circuit 10 receives the output of a demodulator. As shown here input 24 has a 175 mV dc input and a 25 mV peak ac input at approximately 1200 Hz. This input is typically fed through a source resistor 26 and then through filter 16 to the inverting input 22 of comparator 12. It is also fed to the non-inverting input 20 of comparator 12 which may be provided with a balance resistance 28 to balance bias currents that may be inherent in comparator 12. Filter circuit 16 includes filter resistance 30 which receives the input through source resistance 26 and delivers it to the inverting input 22 of comparator 18. Filter circuit 16 also includes filter capacitance 32 and may include a shunting diode 34. Positive feedback circuit 14 includes feedback resistance 36. In a conventional feedback circuit positive feedback would be completed through phantom line 38 directly to the non-inverting input 20 of comparator 12. However, in this invention, the effect of positive feedback circuit 14 may be enhanced by extending the loop as at 38a so that it provides not only a signal to non-inverting input 20 through node 40 and balance resistance 28 but it also provides the feedback signal through node 42 and filter resistance 30 to the inverting input 22 of comparator 12.

Figure 2:
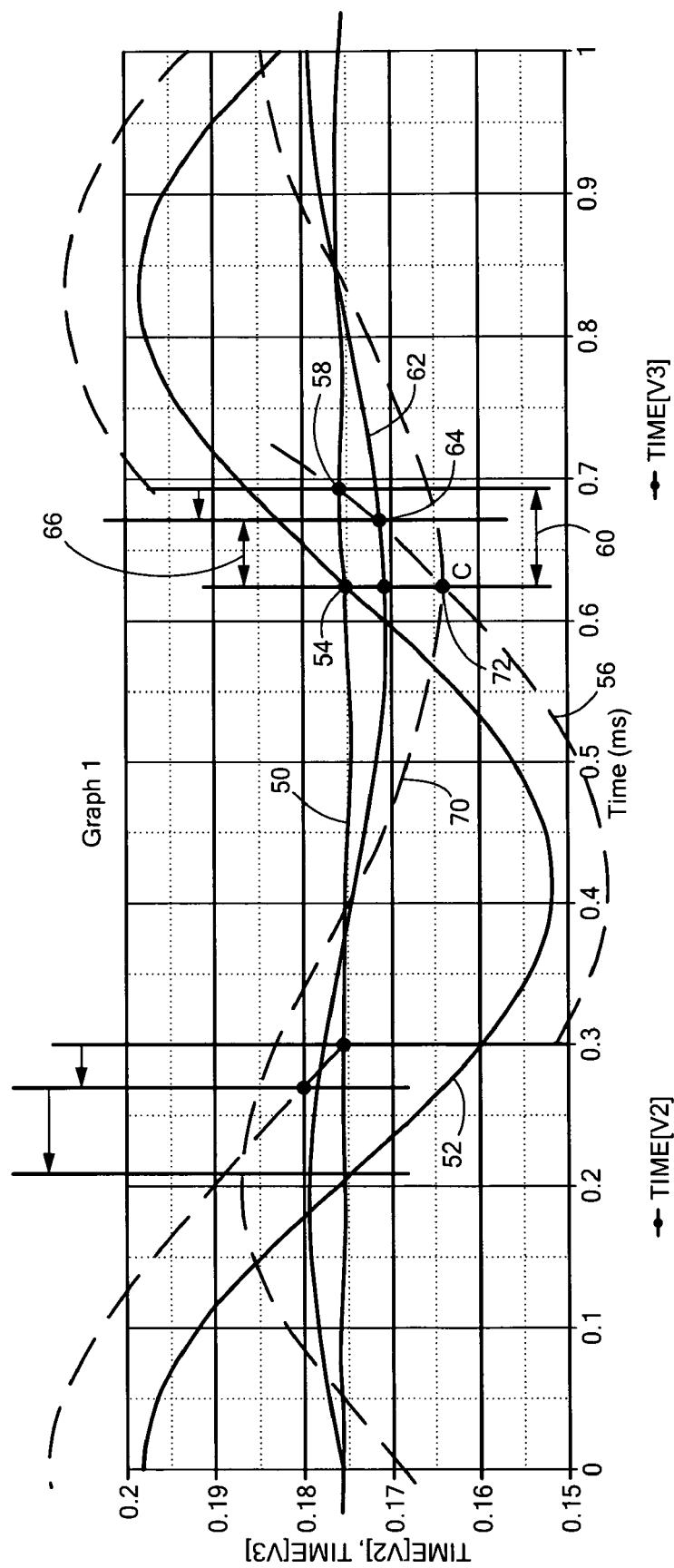
FIG. 2 illustrates the effect of an infinite capacitance filter with and without conventional hysteresis, and the effect of reduced filter capacitance and enhanced positive feedback according to this invention.

Employing the values for the capacitance 32 and resistances 26, 28, 30 and 36 shown in FIG. 1 the waveforms illustrated in FIG. 2 are obtained. Referring to FIGS. 1 and 2, assuming the filter capacitance 32 is an infinite capacitance the dc level 50 provided at inverting input 22 will be a straight flat line. The ac sine wave 52 coming from the output of the demodulator will thus intersect the dc level 50 at point 54, thereby defining the cross-over point. This is the case with no positive feedback: no hysteresis.

Employing a conventional prior art positive feedback circuit using connection 38 hysteresis 56 is introduced so that the zero crossing for infinite capacitance situation occurs at 58 this introduces a delay 60 which results in inaccuracies. This invention rather than seeking to achieve the idealized situation of an infinite capacitance teaches reducing the filter capacitance 32 in any given situation to intentionally provide a non-flat straight line characteristic 50, that is, a waveform 62 that intentionally contains ripple. This ripple causes the hysteresis 56 offset of waveform 52 to intersect with it at point 64 which introduces a much reduced delay 66. The capacitance could be reduced further but to do that one would be approaching a level on inverting input 22 that would reduce the differential voltage between non-inverting input 20 and inverting input 22 and defeat the bit slicing zero cross detection function of comparator 12. Thus, a further reduction in the delay can be achieved without further reducing filter capacitance 32 by employing positive feedback circuit 14 with the enhanced approach indicated by line 38a, FIG. 1, whereby the positive feedback signal is fed not just to non-inverting input 20 but instead is fed to node 40 and 42 so that it is also is delivered to inverting input 22. This increases the ripple producing waveform 70 but does so without further decreasing capacitance 32. With waveform 70, FIG. 2, the intersection with hysteresis 56 occurs at 72 which is ideally right on time with the original idealized intersection at 54.

Speed-up diode 34 may be connected in parallel with resistance 30 in filter 16 in order to speed-up the charging of filter capacitor 32 up to the voltage difference between the average dc input and the diode drop after which continued charging occurs only to the extent that the input signal diverges from the average dc level.

Figure 3:
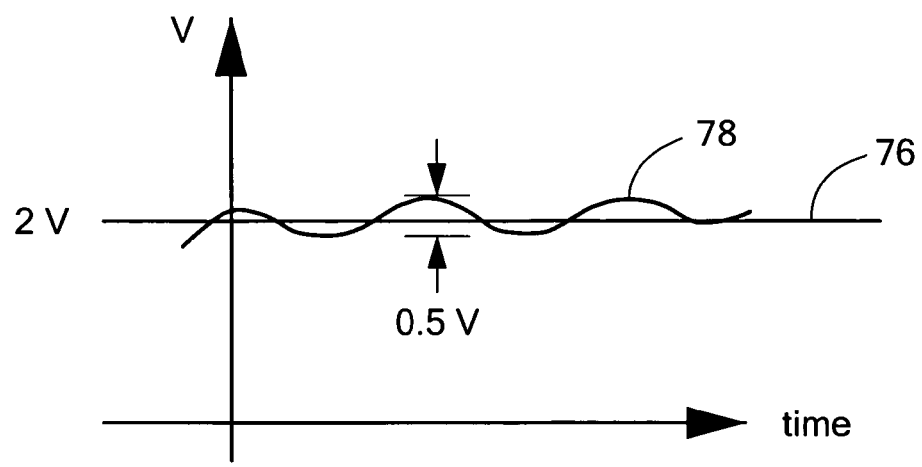
FIG. 3 illustrates an input to the comparator circuit of FIG. 1 when a speed-up diode may be used.
Figure 4:
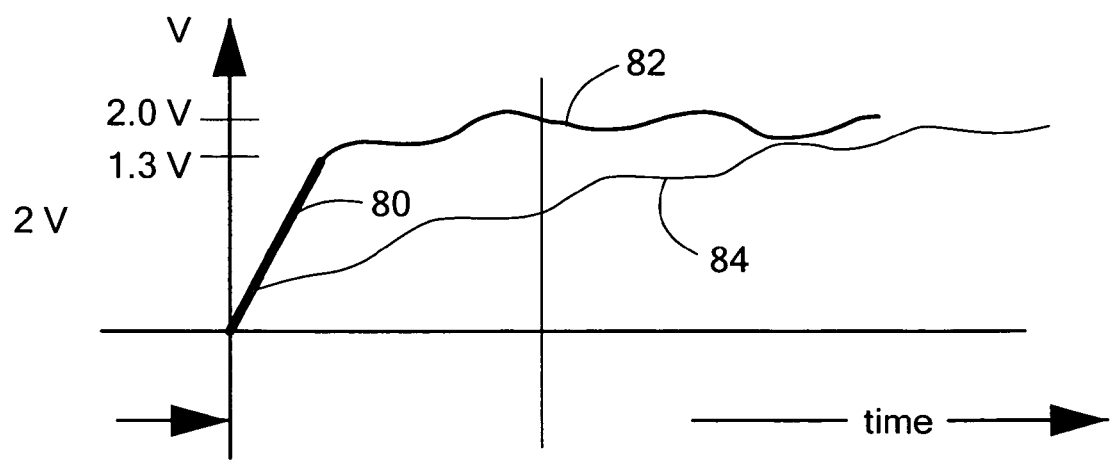
FIG. 4 illustrates an output with and without the diode function.

For example, as shown in FIG. 3, if the input dc voltage were two volts 76 and the ac input was 0.5 peak 78 and diode 34 had a diode drop of 0.7 volts then the charging would be very fast from zero to 1.3 volts: the difference between two volts and the diode voltage drop of 0.7 volts as indicated at 80, FIG. 4. After that it would continue to charge 82 only when the input ac signal goes higher than 1.3 volts and would discharge when it goes below 1.3 volts. The charge path without diode 34 is shown at 84. This diode shunt is not always usable, for example, in the circuit shown in FIG. 1 with the specific values for input dc voltage and ac input voltage shown this would not work since the dc voltage at the input is only a 175 mV not even approaching the diode drop of 0.7 volts or 700 mV.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An improved fast settling bit slicing comparator circuit comprising:
   a comparator having a non-inverting and inverting input; said non-inverting input receiving an input signal;
   a filter circuit for receiving said input signal and being connected with the inverting input of said comparator;
   a source resistance configured to be coupled between an input source and the filter circuit;
   a feedback circuit interconnected between the output of said comparator and the non-inverting input of said comparator for providing a feedback signal that introduces a predetermined hysteresis offset, said feedback circuit additionally interconnected with the inverting input of said comparator through said filter circuit for reducing the effect of the hysteresis offset by providing the feedback signal to both the non-inverting and inverting inputs to reduce the differential voltage between said inverting and non-inverting inputs;
   said filter circuit including a filter resistance and filter capacitance having a reduced time constant sufficient to compensate for at least a portion of said hysteresis offset.

2. The improved fast settling bit slicing comparator circuit of claim 1 in which said feedback circuit is interconnected to said non-inverting input through a balancing resistance for balancing bias currents inherent in said comparator.

3. The improved fast settling bit slicing comparator circuit of claim 1 in which said filter circuit includes a diode in parallel with said filter resistance for accelerating the charging of said filter capacitance up to the level of the voltage difference between the average level and diode drop.

4. An improved fast settling bit slicing comparator circuit comprising:
   a comparator having a non-inverting and inverting input; said non-inverting input receiving an input signal;
   a filter circuit for receiving said input signal and being connected with the inverting input of said comparator;
   a source resistance configured to be coupled between an input source and the filter circuit at the other end;
   a feedback circuit interconnected between the output of said comparator and the non-inverting input of said comparator for introducing a predetermined hysteresis offset and being interconnected with the inverting input of said comparator through said filter circuit for gradually reducing the effect of the hysteresis offset by providing a feedback signal to both the non-inverting and inverting inputs to reduce the differential voltage between said inverting and non-inverting inputs.

5. The improved fast settling bit slicing comparator circuit of claim 4 in which said filter circuit includes a filter resistance and filter capacitance having a reduced time constant sufficient to compensate for at least a portion of said hysteresis offset.

6. The improved fast settling bit slicing comparator circuit of claim 5 in which said filter circuit includes a diode in parallel with said filter resistance for accelerating the charging of said filter capacitance up to the level of the voltage difference between the average level and diode drop.

7. The improved fast settling bit slicing comparator circuit of claim 4 further including a balance resistance coupled to the non-inverting input of said comparator, the feedback circuit interconnected between the output of said comparator and the non-inverting input of said comparator through the balance resistance.

8. The improved fast settling bit slicing comparator circuit of claim 7 in which the balance resistance is configured to balance bias currents inherent in the comparator.

9. An improved fast settling bit slicing comparator circuit comprising:
   a comparator having a non-inverting and inverting input; said non-inverting input receiving an input signal;
   a filter circuit for receiving said input signal and being connected with the inverting input of said comparator;
   a feedback circuit interconnected between the output of said comparator and the non-inverting input of said comparator for providing a feedback signal that introducing a predetermined hysteresis offset; and
   a source resistance responsive to an input source and the output of the comparator for introducing a predetermined second offset to said filter circuit, said second offset gradually reducing the effect of the hysteresis offset by reducing the differential voltage between said inverting and non-inverting inputs.

\* \* \* \* \*